United States Patent [19]

Koehler

[11] 4,206,003
[45] Jun. 3, 1980

[54] METHOD OF FORMING A MERCURY CADMIUM TELLURIDE PHOTODIODE

[75] Inventor: Toivo Koehler, Lexington, Mass.
[73] Assignee: Honeywell Inc., Minneapolis, Minn.
[21] Appl. No.: 5,744
[22] Filed: Jan. 23, 1979

Related U.S. Application Data

[62] Division of Ser. No. 812,872, Jul. 5, 1977, Pat. No. 4,137,544.

[51] Int. Cl.² ............................................. H01L 27/14
[52] U.S. Cl. ...................................... 148/1.5; 148/174; 148/188; 357/30; 357/91
[58] Field of Search ..................... 148/1.5, 188, 174; 357/30, 91

[56] References Cited

U.S. PATENT DOCUMENTS

| | | | |
|---|---|---|---|
| 3,673,063 | 6/1972 | Wakefield | 204/140.5 |
| 3,743,553 | 7/1973 | Scott et al. | 148/188 |
| 4,017,881 | 4/1977 | Ono et al. | 357/18 |
| 4,028,145 | 6/1977 | Kasenga | 148/20.3 |
| 4,089,714 | 5/1978 | Johnson et al. | 148/188 |
| 4,105,472 | 8/1978 | Lancaster | 148/1.5 |
| 4,105,477 | 8/1978 | Johnson et al. | 148/187 |
| 4,116,725 | 9/1978 | Shimizu | 148/20.3 |
| 4,129,878 | 12/1978 | Webb | 357/13 |
| 4,132,999 | 1/1979 | Maille' et al. | 357/30 |
| 4,137,544 | 1/1979 | Koehler | 357/30 |

OTHER PUBLICATIONS

Cohen-solal ". . . Infrared Photovoltaic Detectors" Appl. Phys. Letts. 19, (1971), 436.
Donnelly et al., ". . . Photodiode . . . by . . . Ion Implantation" Appl. Phys. Letts. 20, (1972), 279.
Fiorito et al., ". . . Infrared . . . Detectors in 8–14 μm Range" Appl. Phys. Letts. 23, (1973), 448.
Marine et al., "Infrared Photovoltaic Detectors . . ." Appl. Phys. Letts. 23, (1973), 450.

*Primary Examiner*—L. Dewayne Rutledge
*Assistant Examiner*—Upendra Roy
*Attorney, Agent, or Firm*—Theodore F. Neils; David R. Fairbairn

[57] ABSTRACT

A mercury cadmium telluride photodiode includes an n-type mercury cadmium telluride body with an accumulation layer proximate a first surface of the body. A p-type region is formed in the body at the first surface so that the n-type accumulation layer surrounds the p-type region at the first surface.

10 Claims, 5 Drawing Figures

METHOD OF FORMING A MERCURY CADMIUM TELLURIDE PHOTODIODE

This is a division of application Ser. No. 812,872, filed July 5, 1977, now U.S. Pat. No. 4,137,544.

BACKGROUND OF THE INVENTION

The present invention is concerned with mercury cadmium telluride semiconductor devices. In particular, the present invention is directed to an improved mercury cadmium telluride photodiode. For the purposes of this specification, the common chemical notations for mercury cadmium telluride, (Hg,Cd)Te or $Hg_{1-x}Cd_xTe$, will be used.

Mercury cadmium telluride is an intrinsic photodetector material which consists of a mixture of cadmium telluride, a wide-gap semiconductor ($E_g=1.6$ eV), with mercury telluride, which is a semimetal having a negative energy gap of about −0.3 eV. The energy gap of the alloy varies approximately linearly with x, the mole fraction of cadmium telluride in the alloy. By properly selecting "x", it is possible to obtain mercury cadmium telluride detector material having a peak response over a wide range of infrared wavelengths. High performance mercury cadmium telluride detectors have been achieved for wavelengths from about 1 to 30 microns.

Initial work in (Hg,Cd)Te began in the late 1950's. The activity was primarily concentrated in development of photoconductive (Hg,Cd)Te detectors. Increasing interest and use has developed, however, for (Hg,Cd)Te photodiodes.

The formation of pn junctions in (Hg,Cd)Te to produce a (Hg,Cd)Te photodiode is complicated by the small dissociation energy of mercury telluride in the alloy. The formation of pn junctions must not cause excessive dissociation of the mercury telluride, since this will adversely affect the electrical and optical properties of the resulting device.

Several techniques have been developed for forming n-type layers on a p-type body of (Hg,Cd)Te. One of the simplest methods involves the annealing of the p-type (Hg,Cd)Te body in the presence of mercury vapor for a few hours at 300° C. This technique is described in U.S. Pat. Nos. 3,468,363 by Parker, et al.; 3,514,347 by Rodot, et al.; and in an article by Figurovskii, et al., *Soviet Physics-Semiconductors*, 3, 1572 (1969).

Still other techniques for forming n-type layers on a p-type body of mercury cadmium telluride are possible. Among the techniques are bombardment with protons, electrons, or mercury ions. These techniques create an n-type layer by creating a damage induced donor state. These techniques are described in Foyt, et al., "Type Conversion and n-p Junction Formation in $Hg_{1-x}Cd_xTe$ Produced by Photon Bombardment", *Appl. Phys. Lett.*, 18, 321 (1971); Melngailis, et al., "Electronic Radiation Damage and Annealing of $Hg_{1-x}Cd_xTe$ at Low Temperatures", *J. Appl. Phys.*, 44, 2647 (1973); and Fiorito, et al, "Hg-Implanted $Hg_{1-x}Cd_xTe$ Infrared Photovoltaic Detectors in the 8- to 14- μm Range", *Appl. Phys. Lett.*, 23, 448 (1973).

Another technique for forming pn junctions in p-type (Hg,Cd)Te is described by Marine, et al., "Infrared Photovoltaic Detectors from Ion Implanted $Cd_xHg_{1-x}Te$", *Appl. Phys. Lett.*, 23, 450 (1973). This method involves aluminum ion implantation and a subsequent anneal at 300° C. for one hour to form an n-type region in a p-type (CD)Te body.

Still another technique of forming pn junctions in p-type (Hg,Cd)Te is described in U.S. Pat. No. 3,858,306 by Kloek, et al. In this patent, pn junctions are formed in a p-type body of (Hg,Cd)Te by depositing hot indium on the p-type body. The hot indium forms an alloy junction.

Many other references describe the performance or structure of (Hg,Cd)Te photodiodes in which an n-type region is formed in a p-type body. Among these references are T. Kohler and P. J. McNally, *Optical Engineering*, 13, 312 (1974); Spears, et al., *Appl. Phys. Lett.*, 23, 445 (1973); and U.S. Pat. Nos. 3,845,494 by Ameurlaine, et al.; 3,904,879 by Amingual, et al.; and 3,930,161 by Ameurlaine, et al.

For some applications, a p-on-n structure is preferable for a (Hg,Cd)Te photodiode. Techniques for forming p-type layers on n-type (Hg,Cd)Te, however, are not as well developed as the techniques for forming n-type layers on p-type (Hg,Cd)Te. One common method of forming p-type regions in n-type (Hg,Cd)Te is by depositing a gold layer on a surface of the n-type body and then heating the body to diffuse the gold, thereby forming a region of p-type conductivity. This method is described in U.S. Pat. No. 3,743,553 by M. W. Scott, et al. Another technique involves the ion implantation of gold into n-type (Hg,Cd)Te and a subsequent low temperature-short duration heat treatment. This technique is described in my co-pending application Ser. No. 662,293 filed Mar. 1, 1976, which is assigned to the same assignee as the present application.

Further improvements in p-on-n (Hg,Cd)Te photodiodes are very desirable, particularly for photodiodes operating in the important 8 to 14 micron wavelength region. Previous (Hg,Cd)Te photodiodes operating in this wavelength region have had a low zero bias resistance. This resistance has been lower than that necessary for optimum detector performance.

SUMMARY OF THE INVENTION

The present invention is an improved (Hg,Cd)Te photodiode. An n-type body of (Hg,Cd)Te has an accumulation layer proximate a first surface. A p-type region is formed in the body so that the n-type accumulation layer surrounds the p-type region at the first surface.

DETAILED DESCRIPTION OF THE PREFERRED EMBODIMENTS

The present invention is based upon my discovery of certain problems and shortcomings in previous p-on-n (Hg,Cd)Te photodiodes, particularly p-on-n photodiodes for operation in the 8–14 micron wavelength region. In the past, these devices have been typically formed by gold diffusion or gold ion implantation into n-type (Hg,Cd)Te. The devices typically have not had the desired detectivity D*.

While evaluating pn junctions formed in n-type (Hg,Cd)Te by gold ion implantation, I discovered an unusual phenomenon. Spot scans indicated that area outside of the defined junction area exhibited greater phovoltaic response than the junction itself. The surface of the n-type (Hg,Cd)Te was apparently inverting from n to p-type as a result of the zinc sulfide passivation layer which was used on the surface of the (Hg,Cd)Te. This inversion problem is particularly pronounced in (Hg,Cd)Te having a "x" value of about 0.2, which is the material having the proper bandgap for detection of radiation in the 8-14 wavelength region.

Figure 1:
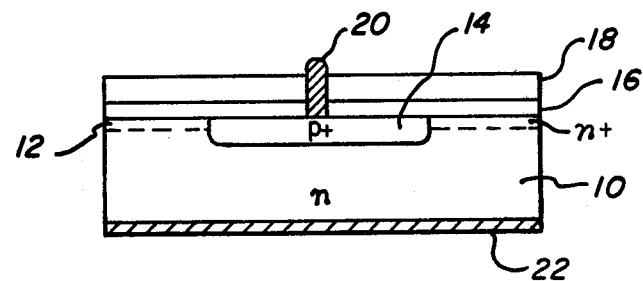
FIG. 1 shows a preferred embodiment of the (Hg,Cd)Te photodiode of the present invention.

FIG. 1 shows a preferred embodiment of the (Hg,Cd)Te photodiode of the present invention, which overcomes the problems of prior p-on-n 8-14 micron (Hg,Cd)Te photodiodes. The photodiode of FIG. 1 includes an n-type body 10 having an n+ accumulation layer 12 proximate a first surface of body 10. A p or p+ region 14 is formed in the body. This p+ region 14 extends from the first surface into the body so that the n+ accumulation layer 12 surrounds p+ region 14 at the first surface. A passivation layer 16 overlays the first surface and an encapsulation layer 18 overlays passivation layer 16. Electrical contact 20 extends through an opening in layers 16 and 18 to make electrical contact with p+ region 14. A backside electrode 22 contacts the back surface of n-type body 10.

In the preferred embodiments, the present invention, n-type body 10 has a carrier concentration of about $1 \times 10^{14}$ to about $1 \times 10^{16}$ carriers/cm$^3$. Accumulation layer 12 has a higher carrier concentration than n-type body 10, typically about $1 \times 10^{17}$ carriers/cm$^3$. Region 14 has a p-type carrier concentration of between about $1 \times 10^{15}$ and $1 \times 10^{17}$ carriers/cm$^3$.

Figure 2A:
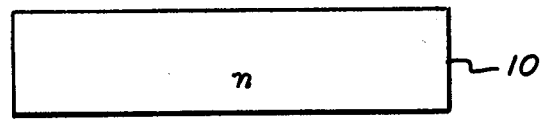
FIGS. 2a–2d show steps in the formation of the photodiode of FIG. 1.

The photodiode of the present invention may be fabricated by a variety of different techniques. One particularly advantageous technique is described in FIGS. 2a-2d. FIG. 2a shows a n-type body 10 prior to any processing. The body has a carrier concentration of between about $1 \times 10^{14}$ and about $1 \times 10^{16}$ carrier/cm$^3$.

Figure 2B:
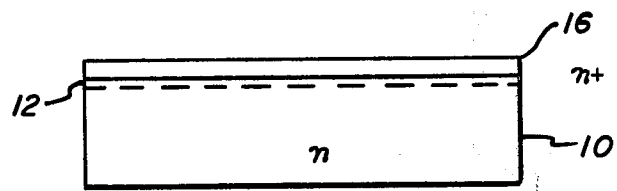

In FIG. 2b, passivation layer 16 has been deposited on the front or first surface of body 10. Passivation layer 16 is of a type which causes an accumulation layer 12 to form at the first surface. One preferred type of passivation layer which results in an accumulation layer is formed by anodization. U.S. Pat. No. 3,977,018 by Catagnus, et. al. describes one technique for forming an anodic oxide passivation layer on a surface of (Hg,Cd)Te.

Figure 2C:
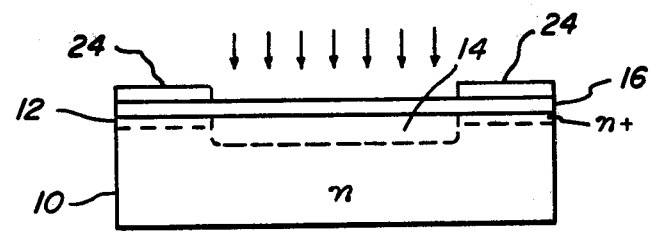

In FIG. 2c, mask 24 has been formed on the surface of passivating layer 16. Mask 24 defines the p+ region which is formed by ion implantation.

As shown in FIG. 2c, an acceptor impurity is implanted into the n-type body 10 in the region 14 defined by a dashed line. The ions are implanted right through the passivating layer 16.

The acceptor impurity being implanted may, for example, be gold. The process of gold ion implantation in (Hg,Cd)Te is described in may previously mentioned co-pending application, Ser. No. 662,293, filed Mar. 1, 1976 which is assigned to the same assignee as the present application. In the preferred embodiments of the invention, however, the preferred acceptor impurity is phosphorous, antimony, or arsenic. These ions are from column Vb of the Periodic Table and substitute in the (Hg,Cd)Te for tellurium. These impurities do not diffuse in (Hg,Cd)Te as rapidly as gold, thereby providing a more stable and well-defined pn junction.

As an example, when phosphorous ions are implanted in (Hg,Cd)Te, the preferred dose is typically between about $5 \times 10^{12}$ ions/cm$^2$ and about $5 \times 10^{13}$ ions/cm$^2$. The energy required for implanting is typically greater than about 100 KeV.

Figure 2D:
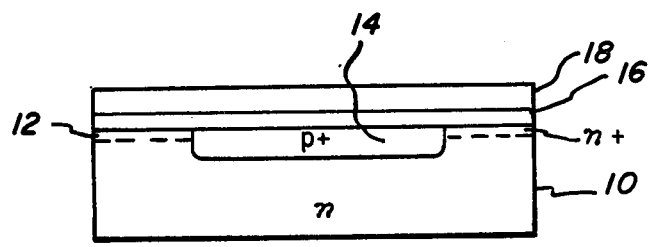

In any ion implantation process in (Hg,Cd)Te, a heat treatment is required subsequent to the implanting of ions, FIG. 2d shows the device after the heat treatment. The acceptor impurities within region 14 have diffused to electrically active positions in crystal lattice and have caused region 14 to become more strongly doped p-type (i.e., p+). As shown in FIG. 2d, an encapsulation layer 18 has been deposited on the surface of passivation layer 16. Encapsulation layer 18 maintains mercury vapor pressure in the device during the post-implanting heat treatment. Encapsulation layer 18 may be, for example, zinc sulfide.

In the case of phosphorous ion implantation to form region 14, the preferred heat treatment is at a temperature between about 200° C. and about 300° C. for a time of between about 20 minutes and about 30 minutes. These time durations include the brief heat up time; the actual time at temperature is slightly less.

After p+ region 14 has been formed by the post-implantation heat treatment, electrical contact is made to p+ region 14 and to the n-type region of body 10. This may be done by forming an opening through encapsulation layer 18 and passivation layer 14 and depositing gold in this opening to form ohmic contact to p+ region 14. Ohmic contact to the n-type region of body 10 may be formed by a metal such as indium or aluminum. The resulting device is as shown in FIG. 1.

The important features of this design are the accumulation layer which prevents the natural inversion of n-type (Hg,Cd)Te and the implantation of acceptors through the passivation to form a pn junction. As has been previously stated, there are alternatives to the specific technique described in FIGS. 2a-2a. For example, accumulation layer 12 can be formed by ion implantation or diffusion of donor impurity such as indium, aluminum, gallium, silicon, bromine, or iodine into the first surface of body 10 to form a shallow n+ accumulation layer. In that case, passivation layer 16 need not be an anodic oxide.

Similarly, although the electrical contacts to the various regions may be made of different materials, or may be formed at different times than those shown in FIGS. 1 and 2a-2d, the particular sequence, contact metals, and contact configurations will determine the desired time at which the contacts are made.

In conclusion, the (Hg,Cd)Te photodiode of the present invention is an improved device particularly useful for detection of radiation in the 8 to 14 micron wavelength region. The photodiode structure, however, is equally applicable to (Hg,Cd)Te photodiodes operating in other wavelength regions as well. While the present invention has been described with reference to a series of preferred embodiments, workers skilled in the art will recognize the changes in form and detail may be made without departing from the spirit and scope of the invention.

The embodiments of the invention in which an exclusive property or right is claimed are defined as follows:

1. A method of making a mercury cadmium telluride photodiode comprising:

forming an accumulation layer proximate a first surface of an n-type mercury cadmium telluride body; and forming a p-type region in the n-type mercury cadmium telluride body proximate the first surface.

2. The method of claim 1 wherein forming an accumulation layer comprises forming an anodic oxide passivation layer on the first surface.

3. The method of claim 1 wherein forming a p-type region comprises implanting acceptor impurities into the body.

4. The method of claim 1 wherein forming a p-type region comprises introducing acceptor impurities into the body at a portion of the first surface.

5. The method of claim 3 wherein forming the p-type region further comprises heat treating the body after implanting.

6. The method of claim 3 wherein implanting of acceptor impurities into the body is through a passivation layer on the first surface of the body.

7. The method of claim 5 wherein forming the p-type region further comprises: encapsulating the first surface prior to heat treating to maintain mercury vapor pressure in the body during heat treating.

8. The method of claim 4 wherein introducing acceptor impurities into the body comprises ion implanting the acceptor impurities into the body.

9. The method of claim 8 and further comprising forming a passivation layer on the first surface prior to ion implanting and wherein ion implanting is through the passivation layer.

10. The method of claim 9 and further comprising forming contact through the passivation layer to the p-type region.

* * * * *